United States Patent [19]

Nelson

[11] 4,141,016
[45] Feb. 20, 1979

[54] AM-FM-CB DISGUISED ANTENNA SYSTEM
[75] Inventor: Thomas E. Nelson, Chardon, Ohio
[73] Assignee: Antenna, Incorporated, Cleveland, Ohio
[21] Appl. No.: 790,266
[22] Filed: Apr. 25, 1977
[51] Int. Cl.² .................. H01Q 1/50; H01Q 1/32; H01H 7/10
[52] U.S. Cl. ............................. 343/858; 343/715; 333/76
[58] Field of Search .............. 333/70 R, 76; 343/715, 343/745, 722, 749, 750, 741, 760, 852, 866, 858

[56] References Cited
U.S. PATENT DOCUMENTS

| | | | |
|---|---|---|---|
| 3,100,893 | 8/1963 | Brueckmann | 343/792 |
| 3,665,310 | 5/1972 | Tweed, Jr. | 325/355 |
| 3,725,942 | 4/1973 | Ukmar | 343/715 |
| 3,733,608 | 5/1973 | McGhay et al. | 333/76 |
| 4,037,177 | 7/1977 | Tyrey | 330/70 R |

*Primary Examiner*—Alfred E. Smith
*Assistant Examiner*—Harry E. Barlow
*Attorney, Agent, or Firm*—McNenny, Pearne, Gordon, Gail, Dickinson & Schiller

[57] ABSTRACT

A vehicle-mounted antenna simultaneously coupled via a passive electrical network to a 40-channel Citizens band transceiver and to an AM-FM receiver is disclosed. A non-loaded whip antenna, sized to be electrically short at Citizens band frequencies, is cowl-mounted in a conventional manner to present the dimensions and general appearance of a standard broadcast band car radio antenna. The passive electrical coupling network includes a broadband compensated, quarter-wave transmission line transformer for impedance matching the electrically short antenna to the Citizens band transceiver, and associated L-C circuits for selectively blocking, bypassing and separating AM and FM band signals relative to each other and to Citizens band signals. The disclosed antenna with its associated network provides excellent AM-FM radio receiver reception while presenting to the Citizens band transceiver a voltage standing wave ratio of 1.5:1 or better.

6 Claims, 2 Drawing Figures

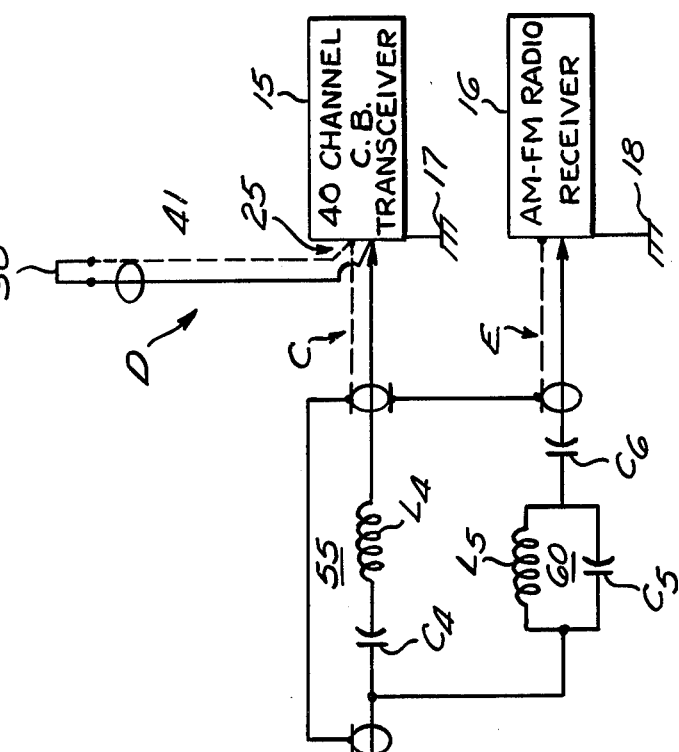
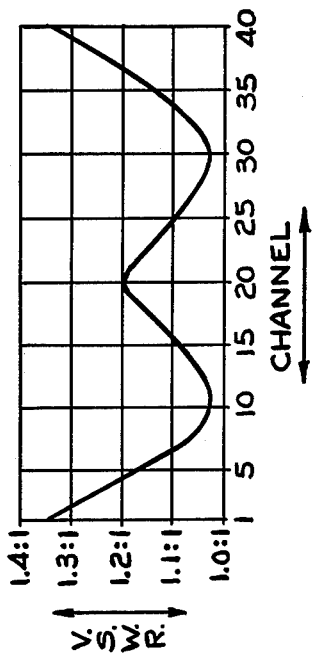
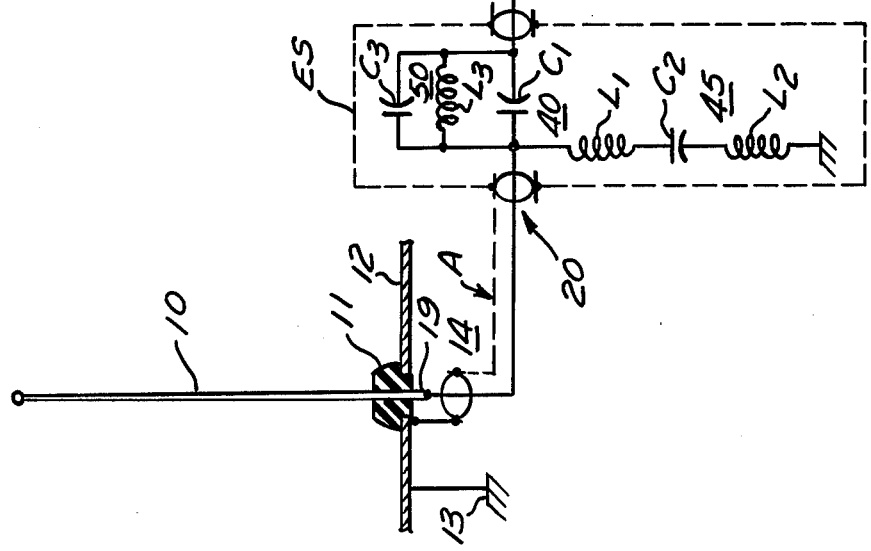

AM-FM-CB DISGUISED ANTENNA SYSTEM

BACKGROUND OF THE INVENTION

This invention relates in general to a passive electrical network for coupling radio frequency circuits, and more particularly to a network for simultaneously coupling a vehicle-mounted standard broadcast band sized whip antenna to a 40 channel Citizens band transceiver and to an AM-FM radio receiver.

Increasing interest by the general public in Citizens band radio communications has created a high demand for relatively expensive Citizens band transceivers, especially of the mobile, vehicle-mounted type. Theft of these transceivers from unattended vehicles has become epidemic.

Numerous structures and methods for discouraging such thefts have been developed, and include removable bracket-mounted transceivers, trunk stowable transceivers and anti-theft locking devices for securing the transceiver to the vehicle.

An obvious means of discouraging transceiver theft is to present to a would be thief the outward appearance of a non-transceiver equipped vehicle. Such desirable outward appearance requires that the characteristic appearance of the associated vehicle-mounted Citizens band transceiver antenna be eliminated. Such antennas are usually long, for example 108 inches (2.75m), or include easily identified loading coils required for efficient signal radiation at Citizens band frequency wavelengths. Typically, mobile transceiver antennas are mounted on the vehicle roof, trunk, or rear bumper.

One solution recognized in the art is to provide an easily removable antenna which for example can be stored within the passenger compartment or trunk of an unattended vehicle.

A more desirable solution is to utilize a permanently mounted Citizens band radio antenna disguised to present the dimensions and general appearance of a conventional cowl-mounted standard broadcast band car radio antenna. It is further desirable to utilize such a disguised antenna for simultaneous Citizens band transceiver communications and AM-FM radio receiver reception, such a single antenna system precluding the need for two separate vehicle-mounted antennas which of themselves, regardless of their individual appearance, would undesirably indicate the probable presence of a Citizens band transceiver to a would be thief.

The present invention provides such a disguised antenna system in a simple, compact, and inexpensive manner.

PRIOR ART

The prior art includes the following:

"Vehicle-Mounted Antenna and Coupling Circuit Therefor" U.S. Pat. No. 3,725,942, issued to Milosh Ukmar.

"CB Antenna Duplexer," authored by Herb Friedman, Electronics Illustrated, Fawcett Publications Inc., March 1962, Vol. 5, No. 2, pp. 66–67, 108 and 110.

"Combinations of Transformers and Stubs," Antenna Engineering Handbook, McGraw Hill Book Co., Inc., First Edition 1961, Section 31.5, authored by David F. Bowman.

"Build A Three-Purpose Antenna," CQ Magazine, Cowan Publishing Co., Vol. 33, No. 4, March 1977, pp. 44, 75, 80.

SUMMARY OF THE INVENTION

The present invention provides an antenna coupler network including a quarter-wave transmission line transformer for impedance matching a 40 channel Citizens band transceiver to an antenna circuit including a non-loaded, vehicle mounted, whip antenna that has an electrical length substantially less than one-fourth wavelength at Citizens band frequencies, the antenna being responsive to AM, FM and Citizens band signals.

Compensating circuit means, including a detuned L-network and a shorted transmission line stub, are electrically associated with the transformer and serve to broaden its useable frequency response bandwith to approximately 500 kilohertz so as to provide an acceptable 1.5:1 voltage standing wave ratio or better over the frequency range of 26.965 megahertz to 27.405 megahertz which includes the Citizens band channels.

Transfer and blocking circuit means, operative to prevent the compensating circuit means from electrically inhibiting or grounding AM band signals, serve to transfer AM and FM band signals, via a portion of the transformer, from the antenna to an associated AM-FM radio receiver. The blocking and transfer circuit means also serve to isolate the Citizens band signals and AM-FM band signals from the AM-FM radio receiver and Citizens band transceiver respectively.

The invention permits simultaneous use of a single vehicle-mounted antenna by a 40 channel Citizens band transceiver and AM-FM radio receiver.

BRIEF DESCRIPTION OF THE DRAWINGS

FIG. 1 is an electronic circuit diagram of a preferred embodiment of the present invention.

FIG. 2 is a graph illustrating the relative response of the preferred embodiment of the invention as a function of voltage standing wave ratio and frequency.

DETAILED DESCRIPTION OF THE PREFERRED EMBODIMENT

Referring to the drawings in greater detail and in particular to FIG. 1, a non-loaded whip antenna 10 is conventionally mounted via an appropriate electrically insulating bushing 11 to the cowl or upper fender portion of an electrically conductive vehicle body 12 which serves in a well known manner as a common electrical ground means 13 for vehicle electrical systems.

The antenna 10, formed of stainless steel, is approximately 32 inches in length (81 cm) so as to present the general dimensions of a standard broadcast band car radio antenna. The antenna 10, electrically responsive to AM, FM and Citizens band signals, has an electrical length substantially less than one-fourth wavelength at Citizens band frequencies (26.965–27.405 megahertz). Electrically connected to the vehicle-mounted end 19 of the whip antenna 10 is one end of a first length of coaxial transmission cable A, the antenna 10 and cable A constituting an antenna circuit 14.

A vehicle associated 40 channel Citizens band transceiver 15 and AM-FM radio receiver 16, having electrical ground means 17 and 18, respectively, in common with the electrical ground means 13 of the vehicle body 12, may, in accordance with the present invention, simultaneously utilize the antenna 10 for Citizens band radio communications and AM-FM radio reception.

Electrical connection between the antenna circuit 14 and the transceiver 15 and receiver 16, for effective transfer of AM, FM and Citizens band signals, is provided by an antenna coupler network which includes a transmission line impedance matching transformer having a first end 20, a second end 25 and a midsection including a second length of coaxial transmission cable B and a third length of coaxial cable C. By conventional design, the combined lengths of the second coaxial cable B and the third coaxial cable C, are approximately equal to an odd multiple of one-fourth wavelength at 27.2 megahertz, the approximate mid-frequency of the Citizens band.

The frequency response bandwith of the transmission line impedance matching transformer alone is not wide enough to provide an acceptable 1.5:1 voltage standing wave ratio over the entire Citizens band.

Desirable broadening of the transformer frequency response characteristics is accomplished by associated compensating means, including a first compensating circuit 40 and a second compensating circuit 41, to provide a useable bandwith of approximately 500 kilohertz which is wide enough to accommodate the 40 Citizens band channels.

The first compensating circuit 40, electrically associated with the first end 20 of the transmission line transformer, is constituted by an inductor $L_1$ and a capacitor $C_1$. The capacitor $C_1$ is electrically connected in series between the first end 20 of the transformer and one end of the second length of coaxial cable B, the other end of cable B being connected to one end of cable C via a second blocking circuit 55 to be explained subsequently. The inductor $L_1$ is electrically connected at one end to that end of the capacitor $C_1$ connected to the first end 20 of the transformer. The other end of the inductor $L_1$ is electrically connected to electrical ground at Citizens band frequencies. The configuration of inductor $L_1$ and capacitor $C_1$ is, commonly referred to as an "L" network.

The second compensator circuit 41 is constituted by a fourth length of coaxial cable D which is shorted by a conductive link 30 at one end with its other non-shorted end being electrically connected to the second end 25 of the impedance transformer, to which the other end of cable C is also connected.

The first and second compensating circuits 40-41 as heretofore described serve to introduce appropriate reactance into the transmission line transformer so as to each compensate for frequency variations on one half of the quarter wave transmission line transformer.

The disclosed transmission line impedance matching transformer with its associated compensating means as described is known in the art.

The antenna 10 of the antenna circuit 14 is electrically connected, via the first length of cable A, to the first end 20 of the transmission line impedance matching transformer while the Citizens band radio 15 is electrically connected to the second end 25 of the transformer.

Electrically associated with the transmission line transformer and its compensating circuits are transfer and blocking circuit means constituted by numerous L-C circuits which function so as to allow AM-FM band signals to pass from the antenna 10 to the AM-FM radio receiver 16.

A first blocking circuit 45, constituted by a series connected inductor $L_2$ and capacitor $C_2$, is inserted between the "L" network inductor $L_1$ and electrical ground as illustrated.

The second blocking circuit 55, constituted by a series connected inductor $L_4$ and capacitor $C_4$, is inserted between the second length of coaxial cable B and third length of coaxial cable C.

A first transfer circuit 50, electrically paralleling the "L" network capacitor $C_1$, is constituted by an inductor $L_3$ and a capacitor $C_3$ in parallel relationship with each other.

A second transfer circuit 60 is inserted between the second length of coaxial cable B and the AM-FM radio receiver 16, the electrical connection between the receiver 16 and the second transfer circuit 60 being via a fifth length of coaxial cable E. The second transfer circuit 60 is comprised of an inductor $L_5$ and capacitor $C_5$ in parallel with each other and having common ends connected to the second length of cable B which constitutes a portion of the midsection of the transmission line transformer. The other common ends of the inductor $L_5$ and capacitor $C_5$ are connected to the fifth length of cable E via a series inserted capacitor $C_6$.

An appropriate electrostatic shield ES is provided in a conventional manner to enclose the first compensating circuit 40, first blocking circuit 45 and the transfer circuit 50. The shield ES reduces vehicle ignition electromagnetic interference.

The operation of the circuitry illustrated in FIG. 1 will now be separately discussed with regard to Citizens band signals, AM band signals and FM band signals.

First frequency band signals, such as Citizens band signals in the frequency band of 26.965–27.405 megahertz, are electromagnetically induced into the antenna 10 and travel along cable A to the first end 20 of the transmission line transformer. The antenna 10, presenting a very low impedance (1 to 10 ohms) at its mounted end 19, and cable A forming the antenna circuit 14 typically present at the first end 20 an impedance closer to 50 ohms having high capacitive reactance characteristics due to the short electrical length of the whip antenna 10.

The first compensating network 40, cancels out the high capacitive reactance, and in a well known manner, is slightly detuned, thus shifting the impedance higher than 50 ohms, for example approximately 75 ohms. This functions to set up the impedance required for the broadbanding effect. Cable B, cable C and shorted stub cable D are of predetermined lengths operable to bring the impedance at the second end 25 of the impedance matching transformer to a nominal balanced 50 ohms, the typical output impedance of the transceiver 15. Broadband impedance matching is thus accomplished. A more detailed description concerning the design and operation of the transmission line transformer and compensating circuits can be found in Section 31.5 of the Antenna Engineering Handbook (McGraw Hill Book Co., Inc., First Edition 1961) entitled "Combinations of Transformers and Stubs," by David F. Bowman.

The first blocking circuit 45 presents a relatively low impedance to the Citizens band frequency signals, thus electrically grounding at Citizens band frequencies that end of the L-network inductor $L_1$ connected to the first blocking circuit 45.

The first transfer circuit 50 presents a relatively high impedance to Citizens band signals so as to preclude bypassing of capacitor $C_1$ by Citizens band signals.

The second blocking circuit 55 is a series resonant circuit at Citizens band frequencies so as to present a low impedance to Citizens band signals allowing them to pass through to the transceiver 15.

The second transfer circuit 60 presents a high impedance to Citizens band signals, thus desirably isolating the AM-FM radio receiver from CB signals, which during a transceiver transmission mode, could damage the input circuitry of the receiver 16.

The operation of the coupler network as described above is substantially identical when the transceiver is in a transmit mode as opposed to a receiver mode.

Operation of the coupler network relative to second frequency band signals, such as AM frequency band signals, will now be discussed.

AM band signals (535–1605 kHz), electromagnetically induced into the antenna 10, are fed, via cable A to the first end 20 of the transmission line transformer. L-network capacitor $C_1$ presents a relatively high impedance to AM band signals, while L-network inductor $L_1$ presents a relatively low impedance to AM band signals.

The first blocking circuit 45 is series resonant at Citizens band frequencies so as to present a high impedance to AM band signals thus isolating the AM band signals from electrical ground. But for the provision of the first blocking circuit 45, the AM band signals would be grounded due to the low impedance of inductor $L_1$.

The first transfer circuit 50 serves to bypass the blocking impedance of capacitor $C_1$ by presenting a low impedance to AM band signals, the transfer circuit being a parallel resonant circuit at Citizens band frequencies. Cable B, a portion of the midsection of the transmission line transformer now carries both AM and FM band signals.

The second blocking circuit 55, series resonant at Citizens band frequencies, provides a high impedance to AM band signals to prevent their being shorted to ground via the conductive link 30 of the second compensating circuit 41.

The second transfer circuit 60 presents a low impedance at AM band frequencies thus permitting transfer of AM band frequencies to the AM-FM radio receiver 16.

Third frequency signals, such as FM band signals (88–108 MHz), are isolated from electrical ground by the high impedance of inductor $L_1$ at FM frequencies while the FM band signals are transferred to cable B, a portion of the midsection of the transmission line transformer, via capacitor $C_1$ which presents a low impedance at FM band frequencies.

It can be seen that cable B carries AM-FM and Citizens band signals.

Blocking circuit 55 presents a high impedance to FM band signals while transfer circuit 60 presents a low impedance to FM signal so as to transfer them from cable B to the AM-FM radio receiver 16.

It can be seen that blocking circuit 55 serves as a bandpass filter to Citizen band frequency signals while transfer circuit 60 serves as a bandpass filter to AM and FM band frequency signals.

FIG. 2 illustrates the characteristic standing wave ratio "W" curve obtainable over the 40 Citizen band channels by the preferred embodiment of applicant's invention. It can be seen that a standing wave ratio of 1.35:1 or less has been obtained.

By way of example and not limitation the following component parameters have been found entirely satisfactory for an antenna system in accordance with the present invention:

| | |
|---|---|
| Cable A | 18 1/8 inches (46 cm) |
| Cable B | 49 3/4 inches (126.4 cm) |
| Cable C | 152 3/16 inches (386.6 cm) |
| Cable D | 15 3/16 inches (38.6 cm) |
| Cable E | 12 inches (30.5 cm) |
| (All cables are standard RG-58 U, nominal 50 ohm coax) | |
| $C_2, C_3, C_4, C_5$ | 100 picofarads (Silver/Mica Type) |
| $C_1$ | 5 picofarads (Silver/Mica Type) |
| $C_6$ | 82 picofarads (Ceramic Type) |
| $L_1$ | approx. .55 $\mu$h |
| $L_2, L_3, L_4, L_5$ | approx. .4 $\mu$h |
| (All inductors are formed of #20 enameled wire close wound on a 1/4 inch mandrel.) | |

Although preferred embodiments of this invention are illustrated, it is to be understood that various modifications and rearrangements of components may be resorted to without departing from the scope of the invention claimed herein.

I claim:

1. A passive electrical network for simultaneously coupling an antenna circuit to a first radio frequency circuit and to a second radio frequency circuit comprising:

a transmission line impedance matching transformer operative for electrical connection and impedance matching between an antenna circuit means and a first radio frequency circuit, said antenna circuit means being responsive to at least first frequency band signals and second frequency band signals, said antenna circuit means including an antenna having an electrical length substantially less than one-fourth wave length of said first frequency band signals;

compensating circuit means electrically associated with said transformer, said compensating circuit means being operative to broaden the band of frequency response of said transformer to said first frequency band signals, said compensating circuit means providing a high impedance to said second frequency band signals to substantially block the transfer of said second frequency band signals from said antenna to said first radio frequency circuit via said transformer, said compensating circuit means providing a low impedance to said second frequency band signals to substantially transfer said second frequency band signals from said antenna circuit means to an associated electrical ground, said compensating circuit means including a shorted coaxial cable stub and an L-C network detuned over said first radio frequency band;

transfer circuit means operative to transfer said second frequency band signals from said antenna to a second radio frequency circuit by bypassing said high impedance of said compensating circuit means;

blocking circuit means providing a high impedance to said second frequency band signals to substantially isolate said frequency band signals from said electrical ground means, said blocking circuit means preventing the electrical grounding of said second frequency band signals by said compensating circuit means; and circuit means electrically associated with said second radio frequency circuit for blocking the transfer of said first radio frequency band signals to said second radio frequency circuit.

2. A passive electrical network for simultaneously coupling an antenna to a radio receiver and to a Citizens band transceiver comprising:

a transmission line impedance matching transformer having a first end, a midsection and a second end, said first end being adapted for electrical connection to an antenna circuit responsive to at least first frequency band signals and second frequency band signals, said second end being adapted for electrical connection to a transceiver responsive to said first frequency band signals, said antenna circuit including an antenna having an electrical length substantially less than one-fourth wavelength of said first frequency band signals;

first and second compensating circuits electrically associated with said first and second ends respectively, said compensating circuits being operative to broaden the band of frequency response of said transformer to said first frequency band signals, said first compensating circuit providing a high impedance to said second frequency band signals to substantially block the transfer of said second frequency band signals between said first end and said midsection, said first compensating circuit providing a low impedance to said second frequency band signals to substantially transfer said second frequency band signals from said first end to an associated electrical ground means;

a first blocking circuit series inserted between said first compensating circuit and said electrical ground means, said blocking circuit providing a high impedance to said second frequency band signals to substantially isolate said second frequency band signals from said electrical ground means so as to prevent the electrical grounding of said second frequency band signal by said first compensating circuit means;

a first transfer circuit means electrically connected between said first end and said midsection, said first transfer circuit means providing a low impedance to said second frequency band signals to substantially transfer said second frequency band signals from said first end to said midsection, at least a portion of said midsection being operative to carry said first and second frequency band signals;

a second transfer circuit connected to said portion of said midsection and operative to transfer said second frequency band signals from said portion of said midsection to a radio receiver, said second transfer circuit providing a high impedance to said first frequency band signals to substantially block the transfer of said first frequency band signals from said portion of said midsection to said radio receiver; and a second blocking circuit series inserted between said portion of said midsection and said radio receiver, said second blocking circuit providing a high impedance operative to substantially block the transfer of said second frequency band signals from said antenna to said second compensating circuit and said radio receiver.

3. A passive electrical network according to claim 2, wherein said first compensating circuit, said portion of said midsection, and said second transfer circuit provide a low impedance path to third frequency band signals for substantial transfer of third frequency band signals from said antenna circuit to said radio receiver, said antenna circuit and said radio receiver being responsive to said third frequency band signals.

4. A passive electrical network according to claim 2, wherein said transformer includes predetermined lengths of coaxial cable.

5. A passive electrical network according to claim 2, wherein said first compensating circuit, said first transfer circuit and said first blocking circuit are electrostatically shielded.

6. In combination:

a vehicle mounted non-loaded whip antenna having an electrical length substantially less than one-fourth wavelength at Citizens band frequencies;

a vehicle mounted 40 channel Citizens band transceiver;

a vehicle mounted AM-FM radio receiver; and a passive electrical network for simultaneously coupling said antenna to said transceiver and said receiver comprising, a coaxial cable formed transmission line impedance matching transformer having a first end, a midsection and a second end, said first end being adapted for electrical connection to said antenna, said antenna being responsive to at least AM, FM and Citizens band signals, said second end being adapted for electrical connection to said transceiver.

first and second compensating circuits electrically associated with said first and second ends respectively, said compensating circuits being operative to broaden the band of frequency response of said transformer to said Citizens band signals, said first compensating circuit providing a high impedance to said AM band signals to substantially block the transfer of said AM band signals between said first end and said midsection, said first compensating circuit providing a low impedance to said AM band signals to substantially transfer AM band signals from said first end to an associated electrical ground means;

a first blocking circuit series inserted between said first compensating circuit and said electrical ground means, said blocking circuit providing a high impedance to said AM band signals to substantially isolate said AM band signals from said electrical ground means so as to prevent the electrical grounding of said AM band signal by said first compensating circuit means;

a first transfer circuit means electrically connected between said first end and said midsection, said first transfer circuit means providing a low impedance to said AM band signals to substantially transfer said AM band signals from said first end to said midsection, at least a portion of said midsection being operative to carry said AM and Citizens band signals;

a second transfer circuit connected to said portion of said midsection and operative to transfer said AM band signals from said portion of said midsection to said radio receiver, said second transfer circuit providing a high impedance to said Citizens band signals to substantially block the transfer of said Citizens band signals from said portion of said midsection to said radio receiver; and a second blocking circuit series inserted between said portion of said midsection and said transceiver, said second blocking circuit providing a high impedance operative to substantially block the transfer of said AM band signals from said antenna to said second compensating circuit and said transceiver, said first compensating circuit, said portion of said midsection, and said second transfer circuit providing a low impedance path to FM band signals for substantial transfer of said FM band signals from said antenna to said radio receiver.

* * * * *